United States Patent [19]

Salopek et al.

[11] 4,311,544
[45] Jan. 19, 1982

[54] COMPONENT TAPING MACHINE

[76] Inventors: Albert Salopek, 23202 Sylvan St., Woodland Hills, Calif. 91406; Joseph Emery, 2247 21st St., Santa Monica, Calif. 90405

[21] Appl. No.: 128,926

[22] Filed: Mar. 10, 1980

[51] Int. Cl.³ ............................................. B32B 31/10
[52] U.S. Cl. ..................................... 156/510; 53/591; 156/552
[58] Field of Search ............... 156/510, 516, 538, 552, 156/566, 567, 568, 591; 53/148, 152, 153, 449, 450

[56] References Cited

U.S. PATENT DOCUMENTS

| | | | |
|---|---|---|---|
| 2,885,849 | 5/1959 | Wohlman | 156/552 |
| 3,421,284 | 1/1969 | Zemek | 156/552 |
| 3,669,309 | 6/1972 | Romeo | 156/552 |
| 3,707,425 | 12/1972 | Jamal | 156/552 |
| 4,021,292 | 5/1977 | Bates et al. | 156/552 |

*Primary Examiner*—Caleb Weston
*Attorney, Agent, or Firm*—Poms, Smith, Lande & Rose

[57] ABSTRACT

An apparatus tapes components having two generally aligned connection wires between two pair of continuous adhesive strips to produce a continuous band of longitudinally-spaced components. Four rolls of adhesive tape are supported upon the apparatus. Tape from two of the rolls is passed between two parallel rows of teeth on two motorized toothed wheels with the adhesive side exposed. The two connection wires from each component are placed between the teeth on the toothed wheels and upon the exposed adhesive. Tape from the other two adhesive rolls passes over a pair of pressure rollers resiliently biased against the toothed wheels. As the toothed wheels rotate toward the pressure rollers, the pressure rollers press the tape from the second pair of tape rolls against the tape from the first pair of tape rolls, thereby pair-wise bonding the four strips of adhesive together on opposite sides of the connection wires to form a continuous band of the components. The components are counted and cutters are then used to remove the end portions of the connection wires extending past the component band, and the band is collected with separator paper on a collection reel.

18 Claims, 10 Drawing Figures

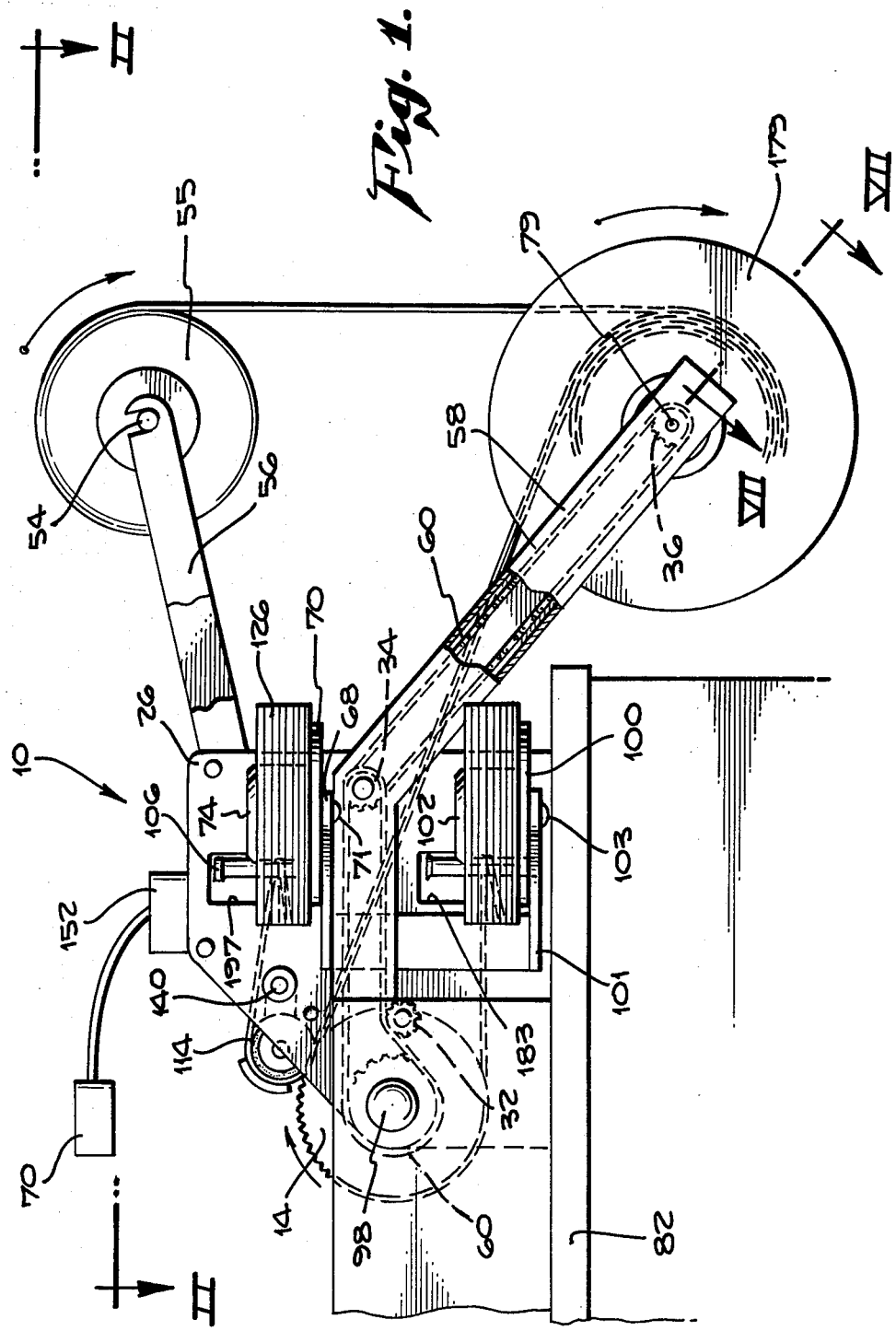

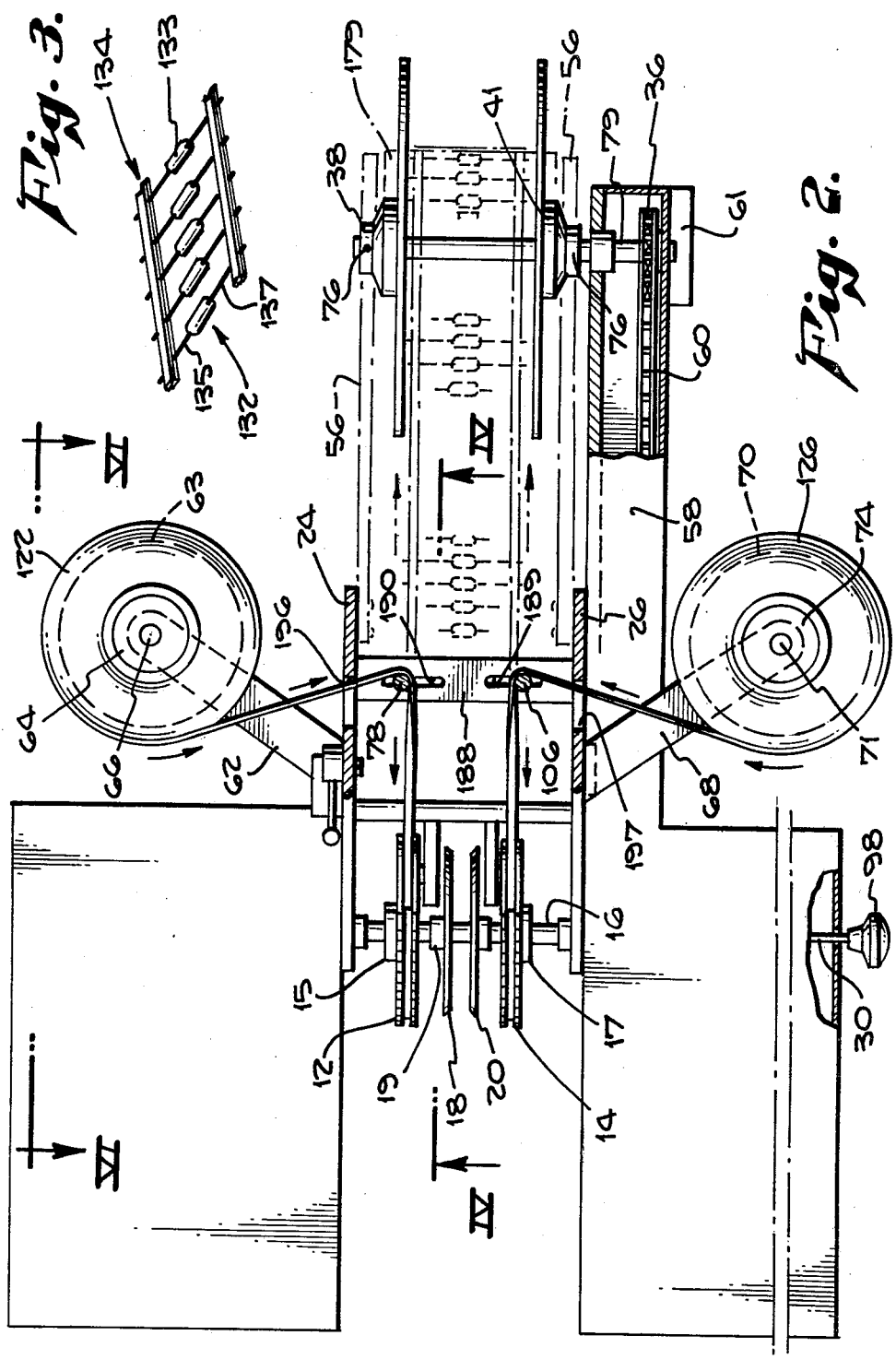

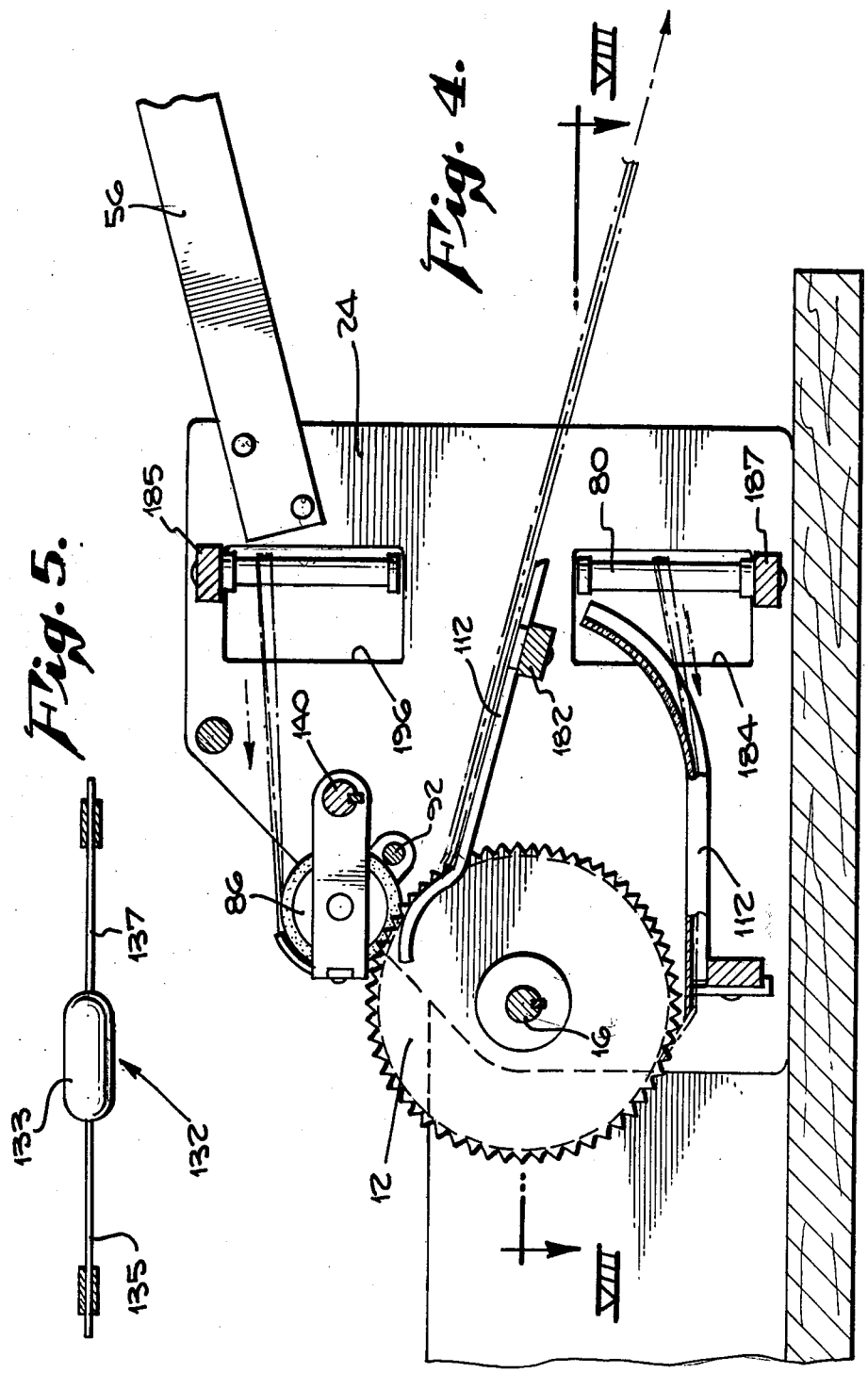

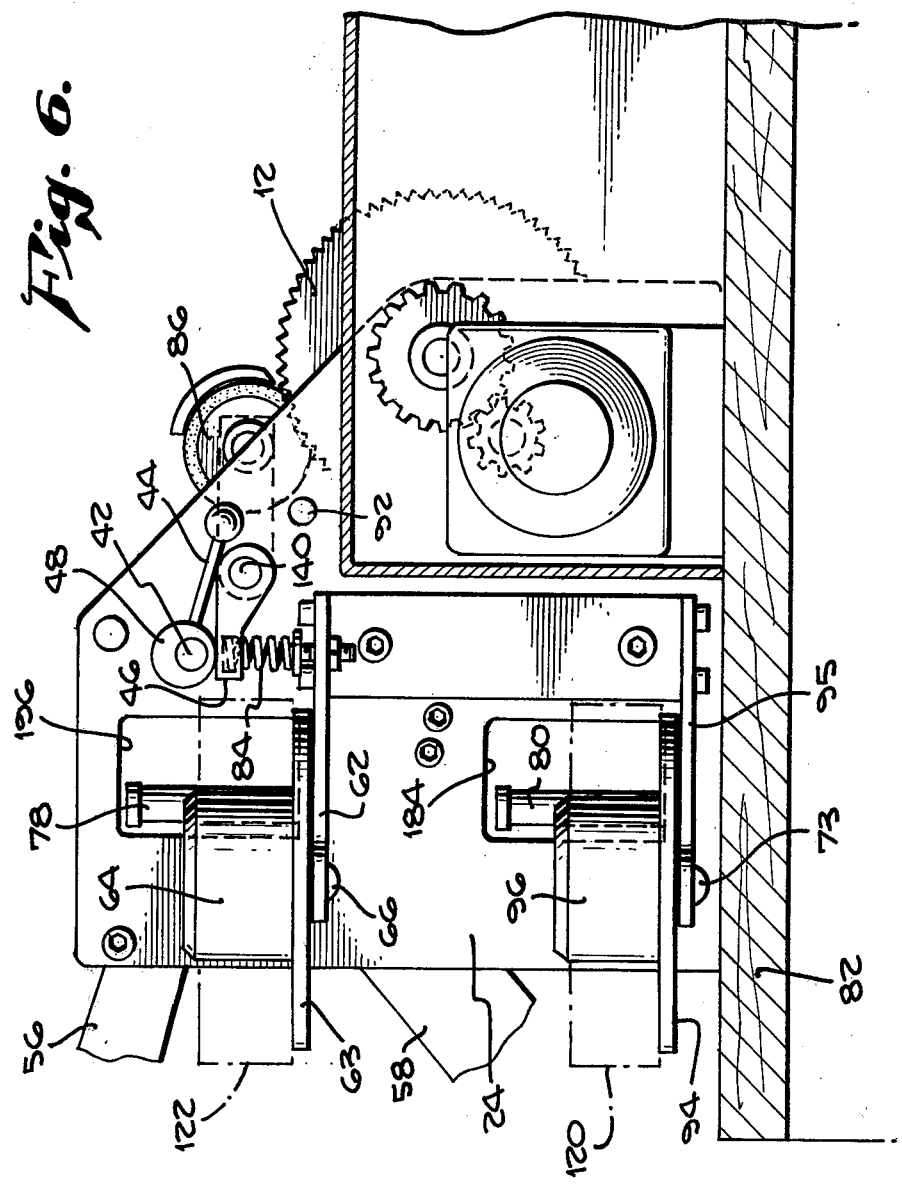

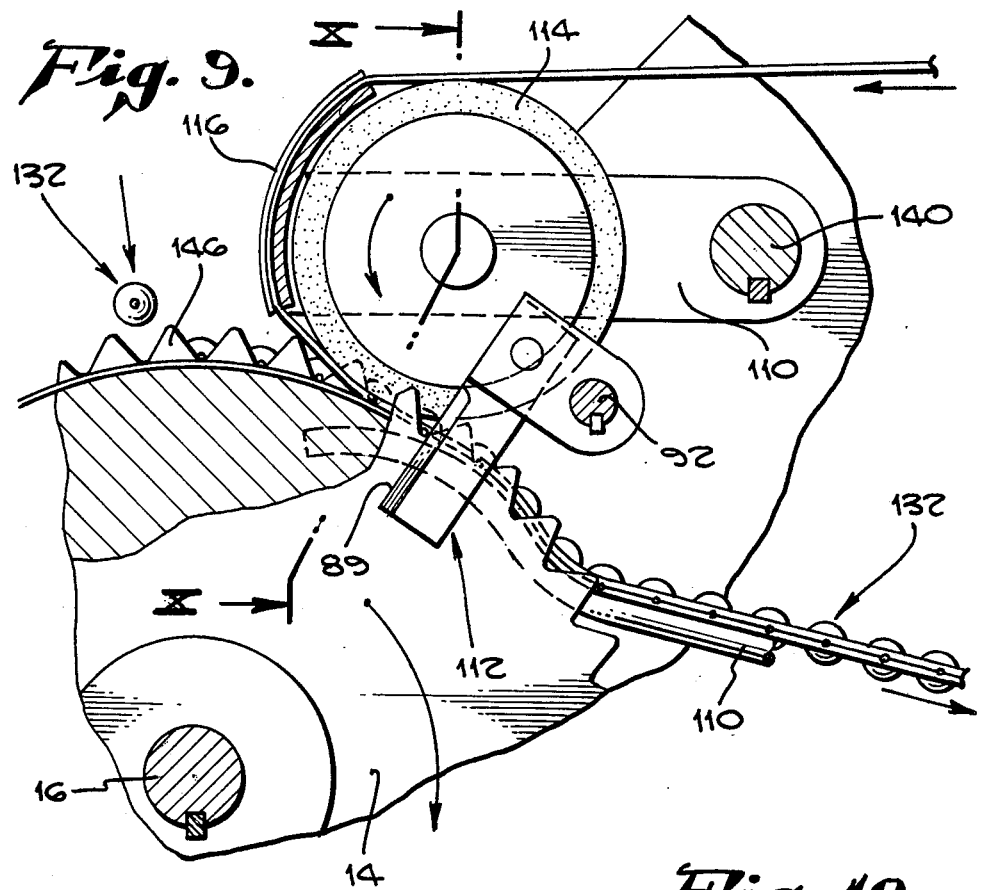
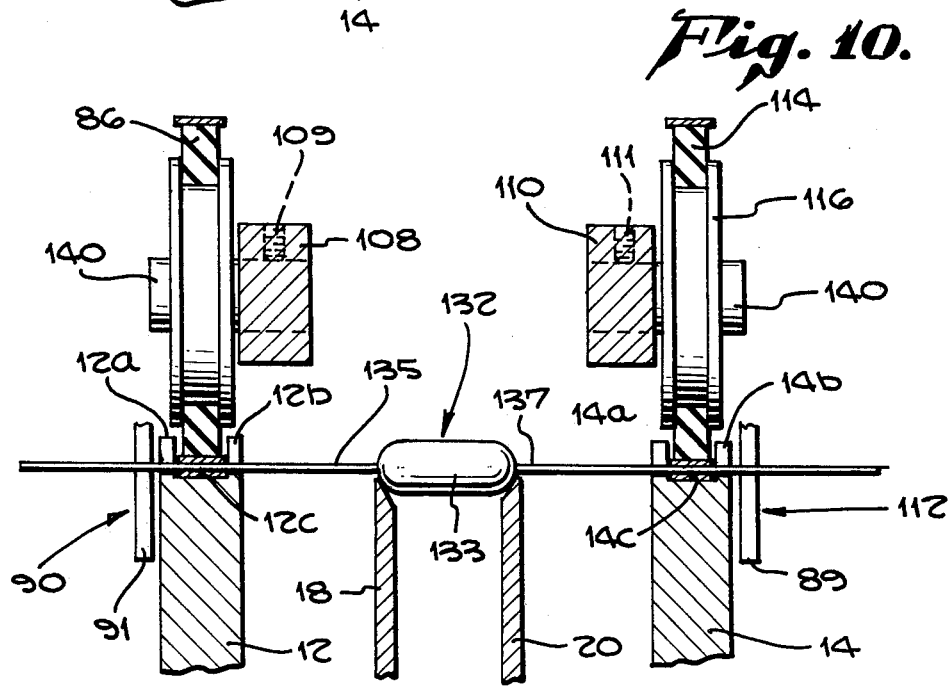

COMPONENT TAPING MACHINE

FIELD OF THE INVENTION

The present invention in general relates to component taping and sequencing machines, and in particular to component taping machines which are manually fed and which produce a reel of taped components.

BACKGROUND OF THE INVENTION

Component taping and sequencing machines are widely used in the electronics industry. Electronic components are frequently taped into continuous bands for purposes of storage and distribution and/or to form an input media to the automated equipment which inserts components into printed circuit boards as part of the manufacture of electronic equipment.

Component taping machines generally fall into two categories. The first category includes those machines which are designed to produce a continuous stream of identical components. These machines are generally referred to as taping machines. Most of the machines found in the prior art which fall into this category are elaborate, high-speed devices which are usually used by large electronic component manufacturers to package their products. These machines, however, while very efficient, are often too costly and require too much maintenance to be affordable by small distributors of electronic components who would have use for such machines in supplying limited quantities of taped components to their customers.

The other type of component taping machines are referred to as sequencing machines. These machines are again usually highly-automated devices which are adapted to automatically select components from a plurality of sources in a predetermined sequence and to thereafter tape these components into a continuous band. Such bands are then utilized in the manufacture of printed circuit boards. The automated component inserting equipment used in the manufacture of printed circuit boards typically cuts the components from the taped bands and sequentially inserts the components into the printed circuit boards in the order in which they are taped together. These machines are also usually expensive, complicated devices which are unaffordable by manufacturers of low-volume, special-purpose printed circuit boards who typically need to sequentially tape only a few hundred components.

Few machines exist which are easily adapted to both the taping of a series of identical components into a continuous band and to the taping of a plurality of different components in predetermined sequence on a continuous band. Of necessity, such machines must be manually fed to allow a human operator to supply either identical components or a predetermined sequence of different components to the machine. In those machines which are adapted for manual feeding, most are rather unsophisticated insofar as they are not easily adjusted to handle various sizes of components, suffer from tape misalignment problems, are usable only with small-diameter reels of tape, and typically do not remove the end portions of the component leads extending past the boundaries of the component band.

A machine which would allow either the repetitive taping of a single component or a sequential taping of a series of components in a simple and efficient manner would find wide use in the electronics industry, not only for the distribution of small quantities of components, but also in the production of specialized low-quantity printed circuit boards, wherein the sophistication of the high-speed sequencing machines is not needed.

Accordingly, it is the principal object of this invention to tape electronic components in a simple and efficient manner.

It is another object of this invention to provide the capability to repetitively tape identical components, and to sequentially tape a plurality of different components.

It is still another object of this invention to provide a manually-fed component taping machine utilizing a simple design requiring little maintenance.

It is another object of this invention to provide a component taping machine capable of using large reels of adhesive tape, to thereby produce a longer band of taped components.

It is a further object of this invention to provide a component taping machine which is easily adapted to tape various sizes of components.

It is another object of this invention to prevent misalignment of the adhesive tape in a component taping machine.

It is a further object of this invention to provide a component taping machine which is simple to operate and quickly tapes electronic components.

SUMMARY OF THE INVENTION

The present invention, in a broad aspect, provides an apparatus for taping components having two generally aligned connection wires between two pairs of continuous adhesive strips to provide a continuous band of the components in spaced longitudinal relation. The apparatus includes provisions for supporting four rolls of adhesive tape and a pair of adjustable component support wheels which guide adhesive tape from one pair of the tape rolls into parallel alignment, with the adhesive side of the tapes being disposed away from the wheels. The wheels receive the connection wires of the components in spaced disposition upon the adhesive. Adjustable centering discs, coaxial with the wheels, axially center the components between the component wheels. A pair of adjustable pressure rollers, pivotally and resiliently biased toward the wheels, include tape guides which guide the adhesive tape from the second pair of tape rolls into alignment with the tape from the first pair of rolls such that the adhesive side of the tape from the second pair of rolls is exposed to the adhesive side of the tape from the first pair of rolls. The pressure rollers press the tape from the second pair of rolls against the tape in the first pair of rolls, thereby pair-wise bonding the tapes to produce a continuous band of taped components.

In accordance with one feature of the invention, cutting blades are used adjacent the wheels to remove the portions of the component wires extending outwardly past the bonded tape.

In accordance with another feature of the invention, the apparatus supports a roll of nonadhesive paper approximately the same width as the component band. A collection reel collects the component band and paper form the roll of nonadhesive paper in a manner whereby the paper is wound on the reel adjacent the band, thereby placing the paper between adjacent layers of the component band on the reel to protect the components. The collection reel is coupled to the component wheels, whereby the rotation of the wheels is transferred to the collection reel. A torque control between the component wheels and the component reels controls the speed of the collection reel relative to the wheels.

In accordance with still another feature of the invention, the component support wheels are driven by a variable-speed motor controlled by a foot switch or the like. The motor speed determines the speed of the production of the component band.

In accordance with a further feature of the invention, the component support wheels include a pair of toothed wheel members coaxially aligned on a common shaft, with each of the wheels having a tape roller surface about its perimeter defined by two adjacent rolls of teeth. The toothed wheels are positioned on the shaft to receive the tape from the first pair of tape rolls between the rows of teeth and to support each of the connection wires of each of the components when manually placed between the two rows of teeth and upon the exposed adhesive.

In accordance with still another feature of the invention, the adjustable centering discs are coaxial with the toothed wheels and axially movable to the edges of the component bodies to determine the relative spacing of the components relative to the toothed wheels.

In accordance with a further feature of the invention, the adjustable pressure rollers which press the strips of adhesive together are adjustably mounted outwardly from a rotatable shaft. Positioned adjacent the rollers are the pair of tape guides which direct tape from the second pair of tape rolls over the rollers for the bonding with the tape from the first pair of tape rolls. The pressure rollers rotate by frictional engagement with the toothed wheels to continually bond the strips of tape together to produce the continuous bands of components.

In accordance with another feature of the invention, the pressure rollers are selectively biased against the toothed wheels by a spring communicating with an arm member attached to the shaft from which the rollers are adjustably and outwardly mounted. The spring urges the pressure rollers against the toothed wheels until an eccentric cam is brought into contact, by means of a lever arm, with the arm member attached to the support shaft. The eccentric cam moves the arm member against the spring, and thereby raises the pressure rollers away from the toothed wheels to allow various adjustments to be made preliminary to or during the taping operation.

In accordance with another feature of the invention, the rolls of adhesive tape may be of a large diameter, thereby eliminating the splicing required with shorter reels in the production of a long band of components.

Other objects, features, and advantages of the present invention will become apparent from a consideration of the following detailed description and from the accompanying drawings.

BRIEF DESCRIPTION OF THE DRAWINGS

FIG. 1 is a side elevational view of a component taping apparatus according to the present invention;

FIG. 2 is a top plan view of the apparatus of FIG. 1 taken through the plane II—II;

FIG. 3 is a view of one section of the component band produced by the apparatus of the present invention;

FIG. 4 is a sectional view of the apparatus of FIG. 2, taken through the plane IV—IV;

FIG. 5 is an end view of the component band produced by the apparatus of the present invention;

FIG. 6 is a side elevational view of the apparatus of FIG. 2, taken through the plane VI—VI;

FIG. 7 is a sectional view of the component band when wound on the collection reel portion of the apparatus shown in FIG. 1 and taken through the plane VII—VII;

FIG. 9 is a sectional view of the apparatus of FIG. 8, taken through the plane IX—IX; and FIG. 10 is a sectional view of the apparatus of FIG. 9, taken through the plane X—X.

DETAILED DESCRIPTION

Figure 8:
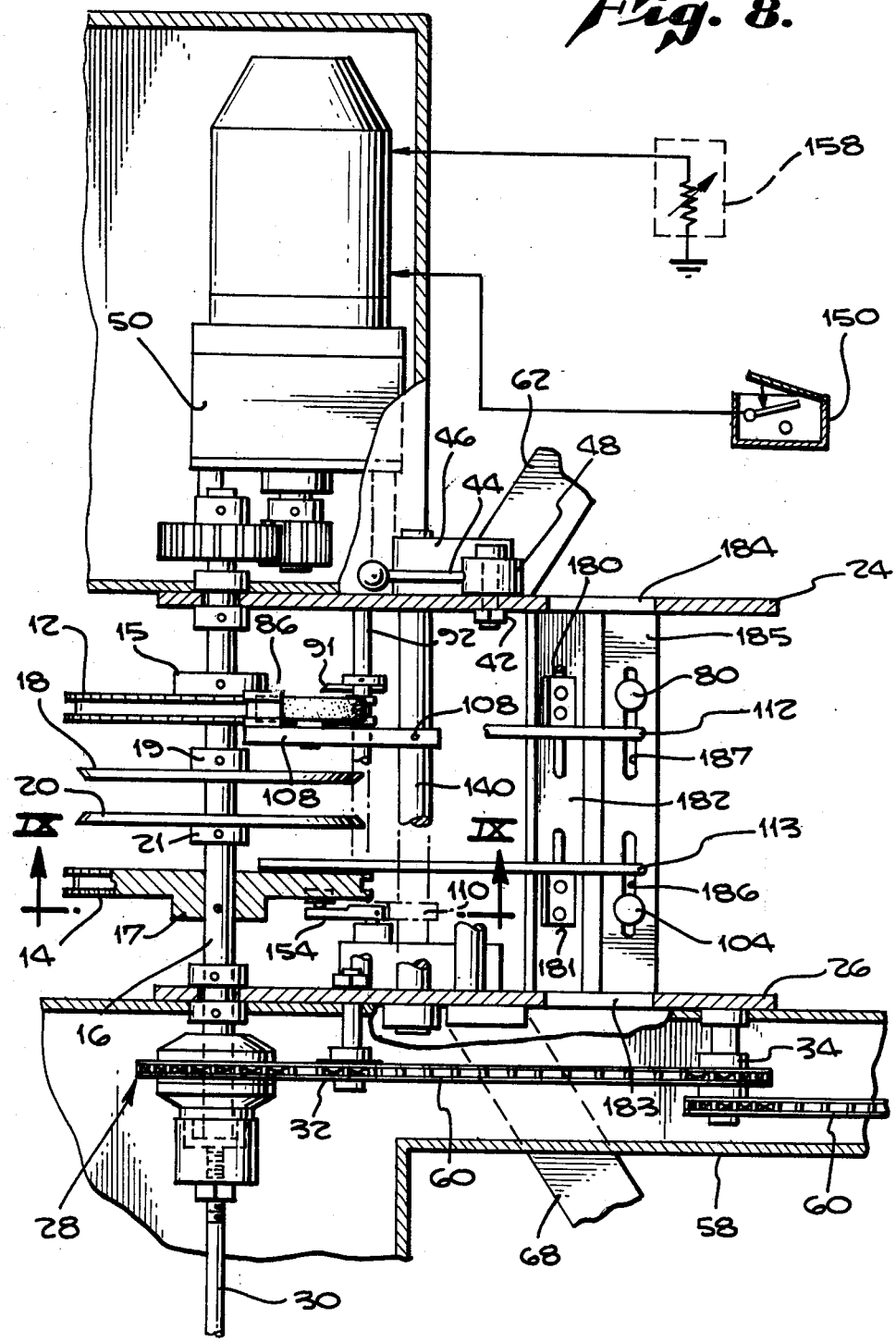
FIG. 8 is a sectional view of the apparatus of FIG. 5, taken through the plane VIII—VIII.

Referring more particularly to the drawings, the component taping machine of the present invention is generally denoted 10. The machine 10 takes adhesive tape from four rolls of adhesive tape 120, 122, 124 and 126 and applies it to the connection leads 135 and 137 of electronic components 132 placed upon two toothed wheels 12 and 14 to produce a continuous band of electronic components 134, which is then wound with separator paper 128 on a collection reel 130.

Referring to FIGS. 1 and 8, it is seen that the apparatus 10 of the present invention is generally constructed about a bottom support member 82, to which is attached two vertical mounting plates 24 and 26. The mounting plates 24 and 26 are designed to support all of the various components of the present invention, thereby providing an apparatus which is easy to adjust and service.

The four rolls of adhesive tape, 120, 122, 124, and 126 are pair-wise mounted to the apparatus in a manner whereby one pair of rolls 122 and 126 is positioned above the other pair of rolls 120 and 124. Tape from the upper two rolls 122 and 126 feed tape guides on two adjustable pressure rollers 86 and 114, while tape from the lower two rolls 120 and 124 feed the two adjustable toothed wheels 12 and 14.

The mounting of the adhesive rolls 120, 122, 124 and 126 is shown in FIGS. 1, 2, 4 and 6. The upper pair of rolls 122 and 126 are each positioned over a respective hub member 64 and 74 attached to a circular flanges 63 and 70. The circular flanges 63 and 70 are in turn rotatably attached by pins 66 and 71 to arm members 62 and 68 rigidly attached to the vertical mounting plates 24 and 26 of the apparatus 10. In a similar manner, the lower pair of adhesive rolls 120 and 124 are respectively placed over hub members 96 and 102 attached to circular flanges 94 and 100 that are rotatably attached by means of pins 93 and 103 to arm members 95 and 101. The arm members 95 and 101 are also rigidly attached to the vertical mounting plates 24 and 26 of the apparatus. In this manner, the four rolls of adhesive tape are pair-wise vertically aligned about two common vertical axes defined by pins 66 and 93 and pins 71 and 103. This particular arrangement of the mounting supports for the adhesive rolls 120, 122, 124 and 126 allows large-diameter adhesive rolls to be used by the apparatus. This feature eliminates the splicing required with smaller reels to produce very long bands of components.

Prior to passing over the pressure rollers 86 and 114, tape from the upper pair of rolls 122 and 126 passes through windows 196 and 197 in plates 24 and 26 over positionable guide posts 78 and 106. These guides posts 78 and 106 ride in slots 190 and 189 with a bar 188 rigidly affixed to the apparatus and change the direction of flow of the tape from the upper two rolls for alignment with the pressure rollers 86 and 114. The slots 190 and 189 allow the guide posts 78 and 106 to accomodate different angles of tape flow caused by different sized tape rolls 122 and 126. In a similar manner, two other moveable guide posts 80 and 104 in slots 187 and 186 in bar member 185 are used to change the direction of flow of tape from the lower pair of tape rolls 120 and 124 passing through windows 184 and 183 for alignment with the toothed wheels 12 and 14. Cooperating with these lower two guide posts 80 and 104 are a pair of guide rails 112 and 113 which both ensure correct positioning of the adhesive tape from the lower two rolls 120 and 124 onto the wheels 12 and 14 and which prevent the end portions of the component leads, when cut from the band 134 from adhering to the exposed adhesive from the lower two rolls 120 and 124. The guide rails 112 and 113 ride in slots 180 and 181 in a bar member 182. The arrangement of the upper guide posts 78 and 106 and the lower guide posts 80 and 104 with their cooperating guide rails 112 and 113 ensure the accurate routing of tape from the upper rolls 122 and 126 and the lower rolls 120 and 124 to the pressure rollers 86 and 114 and toothed wheels 12 and 18. The tape protecting feature provided by the guide rails represents a novel improvement over the prior art, in which the necessity of having to manually remove the cut end portions from the tape frequently caused delays in the taping process.

FIGS. 9 and 10 show the construction of the toothed wheels 12 and 14 in more detail. As shown thereon, each wheel 12 and 14 includes two rows of teeth 12a and 14a and 12b and 14b at its outer perimeter. These teeth form an open channel 12c and 14c in each wheel 12 and 14 which receives adhesive tape from its respective adhesive roll 120 and 124, as the tape is directed into the open channels 12c and 14c by the guide rails 112 and 113. In this manner, the tape from the lower two rolls 120 and 124 makes contact with the lower portion of the wheels 12 and 14 and is rotated upwardly by the wheels 12 and 14, with the adhesive side disposed outwardly, for contact with the components.

The apparatus 10 receives the components 132 onto the toothed wheels 12 and 14. In this regard, the axial leads 137 and 135 projecting from the component body 133 are manually or otherwise placed within corresponding sets of teeth on the two wheels 12 and 14. The spacing of the components on the wheels 12 and 14 determines the longitudinal spacing of the components in the component band 134.

As shown in FIGS. 1 and 3, the toothed wheels 12 and 14 are adjustably mounted on a rotating shaft 16 by means of locking hubs 15 and 17. This arrangement allows the wheels 12 and 14 to be positioned upon the rotating shaft 16 to accommodate components of various sizes.

Power for the apparatus 10 is supplied by a motor 50 attached to the left mounting plate 24. The motor turns the shaft 16 through a gearing assembly 52. In this manner, tape is continually drawn from the lower pair of tape rolls 120 and 124 and all that an operator, or another machine must do is to manually position the component leads 137 and 135 between the teeth on the wheels 12 and 14.

As shown in FIGS. 3, 8 and 10, the present invention includes provisions for adjustably positioning the body portion 133 of the components 132 to any position relative to the wheels 12 and 14. In this regard, mounted to the shaft 16 by means of locking hubs 19 and 21 are two centering discs 18 and 20. The centering discs are adjusted to the outer periphery of the body portion 133 of the components 132. The peripheral portions of the discs 18 and 20 are angled inward to center the components as they are placed between the discs 18 and 20. The ability to position the components body 133 to any location relative to the toothed wheels 12 and 14 to provide either centered or off-centered taping represents a novel improvement over the prior art.

Once the components have been placed between the teeth on the toothed wheels 12 and 14, they adhere to the exposed adhesive in the open channels 12c and 14c from the lower two tape rolls 120 and 124. Once on the wheels 12 and 14, the components are rotated by the motor 50 toward the pressure rollers 86 and 114. As shown in FIGS. 8 and 10, each of the pressure rollers 86 and 114 is rotatably attached to a rigid arm member 108 and 110 attached to a shaft 140. The arm members 108 and 110 are positionable at various locations along the shaft by screws 109 and 111 to locate the pressure rollers 86 and 114 directly above the open channels 12c and 14c in the wheels 12 and 14.

As shown in FIG. 6, the shaft 40 supporting the arm members 108 and 110, to which the pressure rollers 86 and 114 are attached, is constantly biased toward the toothed wheels 12 and 14 by an assembly including an arm member 46 rigidly attached to one end of the shaft 40, an eccentric cam 48 rotatably attached to the left mounting plate 24 by pin 42, a control lever 44 connected to the cam 48, and a spring member 84 positioned between the arm 46 and a supporting shelf 85. As shown in FIG. 6, the control lever 44, in normal operation, is positioned adjacent the shaft 42. This places the lobe portion of the cam 48 away from the arm member 46, thereby allowing the spring member 84 to urge the arm member 46 upwardly. The upward biasing of the arm 46 rotates the shaft 40, and thus the pressure rollers 86 end 114 toward the toothed wheels 12 and 14. The pressure rollers 86 and 114 are then positioned between the teeth on the wheels 12 and 14 to effect the production of the component band 134.

By contrast, when the control lever 44 is moved upwardly, the lobe portion of the cam 48 urges the arm member 46 downwardly, thereby rotating the shaft 40 and pressure rollers 86 and 114 away from the toothed wheels 12 and 14. This provides the machine operator the opportunity to change the position of the toothed wheels 12 and 14, the centering discs 18 and 20, the pressure roller support arms 108 and 110, or to service the machine. This selective biasing of the pressure rollers against the component support wheel also represents an improvement not found in the prior art.

As seen in FIGS. 9 and 10, the pressure roller support arms 108 and 110 each have mounted to them an adjustable taping guide 88 and 116. The taping guides receive tape from the upper two rolls of adhesive tape 122 and 126 after the tape has passed over the guide posts 78 and 106. Tape from the upper rolls 120 and 126 passes over the tape guides 86 and 116 with the adhesive disposed outwardly and is routed beneath the pressure rollers 86 and 114 for pair-wise bonding with the tape from the lower two adhesive rolls 120 and 124 to produce the band of components 134. The motorized rotation of the toothed wheels 12 and 14 is frictionally transferred to the pressure rollers 86 and 114 by the frictional engagement of the pressure rollers 86 and 114 with the toothed wheels 12 and 14. Accordingly, the turning of the toothed wheels 12 and 14, which is transferred to the pressure rollers 86 and 114, draws tape from the lower adhesive rolls 120 and 124 into registry with tape from the upper pair of adhesive rolls 122 and 126 to effect the sandwiching of the component leads 135 and 137 between tape from the upper and lower adhesive rolls 120, 122, 124 and 126 to produce the continuous band of components 134.

As shown in FIGS. 9 and 10, after the components have been taped between the bands of adhesive, the portions of the component leads 135 and 137 extending outwardly past the edges of the adhesive bands are removed by a pair of cutters 90 and 112 attached to a shaft 92 behind the toothed wheels 12 and 14. The cutters each include a cutting blade 91 and 89 rigidly attached to the shaft 92 for positioning immediately adjacent the toothed wheels 12 and 14. The positioning of the cutting blades 91 and 89 adjacent to the wheels 12 and 14 removes any portion of the component leads 135 and 137 extending past the wheels 12 and 14. The cutting assemblies 90 and 112 are positionable along the shaft 92 to accommodate changes in the positioning of the wheels 12 and 14. The inclusion of the cutting assemblies 90 and 112 also represents an improvement over the special-purpose taping machines found in the prior art, which generally do not include such a feature.

After the end-portions of the component leads extending past the edges of the component band 134 have been removed, a special stripper bar 110 is used to urge the component band out of the toothed wheels 12 and 14. As seen in FIG. 9, the stripper bar 110 is rigidly attached to the apparatus 10 adjacent one of the toothed wheels 12. The stripper bar overcomes any binding between the component leads 135 and 137 and the toothed wheels 12 and 14 and also directs the component band away from the toothed wheels. The inclusion of the stripper bar 110 in the apparatus also helps to compensate for tape misalignment problems caused by the machine operator in incorrectly positioning the wheels 12 and 14.

After the component band 134 has been produced as outlined above, it is collected on a collection reel 179 clamped to a shaft 39 by means of two movable hubs 38 and 41 which are clamped to the shaft 39 by set screws 76. The shaft 39 is attached to an arm member 58, which is in turn rotatably bolted to the right mounting plate 26. The arm 58 may be moved to various positions relative to the plate 26 to facilitate the collection of the component band 134.

The collection reel 179 is coupled to the motor 50 and collects the component band 134 at a speed determined by the operator. In this regard, and as shown in FIGS. 1, 2 and 8, the shaft 39, upon which the collection reel 179 is mounted, is coupled to the shaft 16, upon which the toothed wheels 12 and 14 are mounted, by means of a chain drive assembly comprising gear members 32, 34 and 36, and a two-part chain 60. The chain 60 passes within a chain guard 61 over the gears 32, 34 and 36 and also over a conventional torque limiter 28 connected to the shaft member 16 supporting the toothed wheels 12 and 14. The torque limiter 28 provides a control over the amount of the rotative force on shaft 16 which is applied to the shaft 39 supporting the collection reel 179. The torque limiter 28 is attached to a shaft 30 supporting a knob 98. The more the knob 98 is turned in the specified direction, the more of the rotative force of the shaft 16 is transferred by the torque limiter 28 to the drive chain 60 for the turning of the collection reel shaft 39. The ability to control the speed of rotation of the collection reel also represents a novel improvement over the prior art because, for very long component bands, the speed of the collection reel needs to be slowed to effect a uniform collection rate as more of the component band is collected upon the reel 140.

As shown in FIG. 1, the apparatus 10 also includes a support arm 56 and rotating hub 54 which support a roll of nonadhesive separator paper 55. The arm 56 supporting the roll of separator paper 55 is adjustable relative to the apparatus to allow separator paper rolls of various sizes to be used. Paper from the roll of separator paper 55 is wound on the collection reel 179 adjacent the component band 134 to protect the various components in the band during shipping and other handling of the collection reel 140. As shown in FIG. 7, the collection reel 179 thus contains alternate layers of the nonadhesive separator paper from the separator paper roll 55 adjacent layers of the component band 134.

The present invention also includes several other provisions not found in those machines in the prior art. Specifically, the motor 50 may be operated by a conventional foot switch 150 or the like to allow the selective energizing of the motor 50. Also, a microswitch 154 or the like may be positioned adjacent one of the toothed wheels 14 and connected to a conventional resettable counter 152 mounted atop the apparatus 10 to allow the counting of the number of components taped together during a taping run. Also, the apparatus 10 may be provided with a conventional light 70 or the like to assist the operator in the accurate placing of the components upon the toothed wheels 12 and 14. As a final feature, the motor 50 may be provided with a speed control 158 to allow the component band 134 to be produced at varying speeds.

The variable speed feature is especially important in a machine like the special-purpose machine of the present invention which may be used to produce a component band having the same components or a component band having different components placed in a special order. As the latter type of band requires a slower speed of production with a human operator than the former type of band, maximum efficiency can be obtained with the speed control 158.

As can be seen from the foregoing, the present invention provides a component taping machine utilizing a simple, yet efficient, design which allows a relatively unskilled operator to produce bands of electronic components very quickly. Additionally, the simplicity of the design of the present invention results in its simple manufacture and thus its affordability by many electronic component distributors and the like who were previously unable to afford the more elaborate machine currently being produced. Additionally, the reliable and precise operation of the present invention and its ability to tape components of various sizes and shapes will greatly improve the efficiency of production of special-purpose printed circuit boards.

In the foregoing description of the present invention, a preferred embodiment of the invention has been disclosed. It is to be understood, however, that other mechanical and design variations are within the scope of the present invention. Thus, by way of example and not of limitation, means other than toothed wheels could be used to both support the electronic component leads and the adhesive tape; means other than centering discs coaxial with the toothed wheels could be used to center the electronic components; cutting means different than described could be used to remove the end portions of the component leads extending past the edges of the component bands; the pressure rollers could be biased against the component support wheels in a different manner than described; means other than a torque limiter could be utilized to control the speed of the collection reel relative to the component support reel; and the adhesive tape reels could be supported in a different manner than described hereinabove. Accordingly, the invention is not limited to the particular arrangement which has been illustrated and described in detail herein.

What is claimed is:

1. An apparatus for taping components having two generally aligned connection wires between two pairs of continuous adhesive strips to produce a continuous band of said components in spaced longitudinal relation, comprising:
    means for supporting four rolls of adhesive tape;
    adjustable wheel means for both guiding adhesive tape from a first pair of tape rolls into parallel alignment with the adhesive sides of said tapes being disposed away from said wheel means, and for receiving said connection wires of said components in spaced disposition upon said adhesive;
    adjustable centering disc means, coaxial with said wheel means, for axially centering said components upon said wheel means;
    adjustable roller means, pivotally biased towards said wheel means, for both guiding adhesive tape from the second pair of tape rolls into alignment with tape from said first pair of rolls in a manner whereby the adhesive sides of said tapes from said second pair of rolls is exposed to said adhesive side of said tapes from said first pair of rolls, and for pressing said tapes from said second pair of rolls against said tapes from said first pair of rolls, thereby pair-wise bonding said tape from said first and second pair of tape rolls to said connection wires to produce a continuous band of taped components in spaced longitudinal relation between tape from said first and said second pair of tape rolls; and
    cutting means, disposed adjacent said wheel means, for removing the portions of said component wires extending outwardly past said bonded tape.

2. An apparatus as defined in claim 1, wherein said cutting means comprises:
    a pair of cutting blades adjustably mounted to said apparatus adjacent said wheel means, said cutting blades removing any portion of said connecting wires extending outwardly from said component band.

3. An apparatus as defined in claim 1, wherein said apparatus further comprises:
    means for supporting a roll of nonadhesive paper of approximately the same width as said component band; and
    collection reel means for collecting said component band and paper from said roll of nonadhesive paper together, whereby said paper is wound on said reel adjacent said band, thereby placing said paper between adjacent layers of said component band on said reel to protect said components.

4. An apparatus as defined in claim 1, wherein said apparatus further comprises:
    means for guiding said taped component connection wires away from said wheel means after said tapes from said tape rolls have been bonded to said connection wires.

5. An apparatus as defined in claim 1, wherein said apparatus further comprises:
    means, adjustably positioned between said supporting means and said wheel means and said roller means, for modifying the direction of travel of said tapes from said rolls to properly align said tapes with said wheel means and with said roller means.

6. An apparatus as defined in claim 1, wherein said apparatus further comprises:
    motor means for driving said wheel means;
    switch means for activating said motor means;
    means for controlling the speed of said motor, to thereby control the speed of production of said component band; and
    resettable means for counting the number of components used in the production of said component band.

7. An apparatus as defined in claim 3, wherein said apparatus further comprises:
    means for coupling said collection reel means to said wheel means, whereby the rotation of said wheel means is transferred to said collection reel means; and
    torque control means, disposed between said wheel means and said coupling means, for controlling the speed of rotation of said reel means relative to said wheel means.

8. An apparatus as defined in claim 1, wherein said supporting means comprises:
    four support post means, rigidly affixed to said apparatus in pair-wise vertical alignment about two vertical axes, for supporting said second pair of tape rolls above said first pair of tape rolls.

9. An apparatus as defined in claim 1, wherein said wheel means comprises:
    a rotating shaft; and
    a pair of toothed wheels coaxially aligned on said shaft, each of said wheels having a tape roller surface about its perimeter bounded by two adjacent rows of teeth, said toothed wheels being positioned on said shaft to receive said tapes from said first pair of tape rolls between said rows of teeth and to support each of said connection wires from each of said components between said two rows of teeth and upon said exposed adhesive, the circumferential positioning of said components on said wheels determining said longitudinal spacing in said band.

10. An apparatus as defined in claim 9, wherein said apparatus further comprises:
    tape guide means, rigidly affixed to said apparatus between said first pair of tape rolls and said toothed wheels, for protectably directing tape from said first pair of rolls between said rows of teeth.

11. An apparatus as defined in claim 1, wherein said centering disc means comprises:
    a pair of discs mounted coaxially with said wheel means and axially movable to the longitudinal perimeter of the body portion of said components to position said components relative to said wheel means.

12. An apparatus as defined in claim 1, wherein said roller means comprises:
    a rotatable supporting shaft;
    a pair of coaxial resilient pressure rollers;

rigid means, connected between said supporting shaft and said rollers, for adjustably mounting said rollers outwardly from said shaft; and tape guide means, adjustably affixed to said mounting means, for directing tape from said second pair of tape rolls to said pressure rollers for said bonding with said tape from said first pair of said tape rolls.

13. An apparatus as defined in claim 12, wherein apparatus further comprises:

means for selectively biasing said pressure rollers against said wheel means.

14. An apparatus as defined in claim 13, wherein said biasing means comprises:

an arm member having two ends and being rigidly affixed at one end to said rotatable supporting shaft;

spring means, contacting the other end of said arm member, for urging said shaft and said pressure rollers rotatably toward said wheel means; and eccentric cam means, rotatably mounted to said apparatus in contact with said arm member and including a control lever, for moving said arm member against said spring means via said lever, thereby raising said pressure rollers away from said wheel means.

15. An apparatus as defined in claim 7, wherein:

said coupling means comprises a chain drive between said wheel means and said collection reel means, whereby said reel means is rotated by said wheel means; and said torque control means comprises a torque limiter engaging said chain drive for controlling the degree to which said reel means is rotated by said wheel means.

16. An apparatus as defined in claim 4, wherein said guide means comprises:

a contoured guide rail disposed adjacent said wheel means for contact with said component band, said guide rail preventing said connecting wires from remaining in said toothed wheels after said taping.

17. An apparatus as defined in claim 5, wherein said modifying means comprises:

four tape guide members adjustably disposed in slots on said apparatus adjacent said tape rolls, for linearly aligning said tape from said first and second pair of tape rolls with said wheel means and said roller means, respectively.

18. An apparatus as defined in claim 6, wherein said motor means comprises:

an electric motor; and gear means for coupling said motor to said wheel means, whereby said wheel means is continually rotated by said motor and said roller means is driven by frictional engagement with said wheel means.

* * * * *